United States Patent [19]

Fletcher et al.

[11] Patent Number: 4,714,646
[45] Date of Patent: Dec. 22, 1987

[54] ELECTROPHORETIC INSULATION OF METAL CIRCUIT BOARD CORE

[75] Inventors: David L. Fletcher, Georgetown; Arthur E. Graham, Lexington, both of Ky.

[73] Assignee: International Business Machines Corporation, Armonk, N.Y.

[21] Appl. No.: 60,962

[22] Filed: Jun. 17, 1987

Related U.S. Application Data

[63] Continuation of Ser. No. 842,978, Mar. 24, 1986, abandoned.

[51] Int. Cl.$^4$ ............................ B32B 3/00; B05D 5/12
[52] U.S. Cl. .................................... 428/204; 428/901; 428/209; 427/96
[58] Field of Search .................. 428/204, 209, 901; 427/93, 97

[56] References Cited

U.S. PATENT DOCUMENTS

| | | | |
|---|---|---|---|
| 3,441,489 | 4/1969 | Gacesa | 204/181 |
| 3,483,109 | 12/1969 | Brane et al. | 204/181 |
| 3,892,646 | 7/1975 | Lazzarini et al. | 204/181 |
| 4,145,460 | 3/1979 | Finley et al. | 427/97 |
| 4,321,290 | 3/1982 | Thams | 427/289 |
| 4,562,119 | 12/1985 | Darms et al. | 428/458 |
| 4,601,916 | 7/1986 | Arachtingi | 427/97 |

OTHER PUBLICATIONS

"Metal Core Boards—An Alternative for Cooling Critical Components", Sep. 1980 Circuits Manufacturing, pp. 74–80.

Keith F. Blurton et al, "Insulated Holes in Metal Core Substrate", PCK Technology Division, Kollomorgen Corporation.

*Primary Examiner*—John E. Kittle
*Assistant Examiner*—Patrick J. Ryan
*Attorney, Agent, or Firm*—John A. Brady

[57] ABSTRACT

A printed circuit with an internal metal sheet for heat dissipation has a roughened aluminum sheet with via holes coated with acrylic or epoxy resin containing thixotropic fumed silicon dioxide or silicate clay. The resin and thixotropic agent are electrophoretically coated. The thixotropic agent may act both to even the coating around edges and as a material upon which metal plating of the printed circuit is bonded.

4 Claims, No Drawings

ELECTROPHORETIC INSULATION OF METAL CIRCUIT BOARD CORE

This is a continuation of application Ser. No. 842,978, filed Mar. 24, 1986, and now abandoned.

TECHNICAL FIELD

This invention relates to the fabrication of circuit boards having an insulated internal metal layer effective to dissipate heat and therefore to permit higher currents in the electrical elements of the circuit board. An insulation coating is obtained by electrophoretic deposition of a coating composition.

BACKGROUND ART

The generation of heat is an inherent consequence of the controlling of electric power flow by components of a circuit board. Effective dissipation of such heat permits the circuit board to carry more components or to perform at increased power levels. An internal metal layer which is electrically insulated from the electrical components can dissipate such heat, but existing technology has not been satisfactory in producing such circuit boards. Electrophoretic deposition of the insulating layer typically is satisfactory for flat areas, but the insulation is too thin at sharp corners.

The typical circuit board has a number of holes through its body, generally termed via holes. These are occupied with conductive paths which connect circuitry on one surface of the board with circuitry on the opposite surface of the board. Each via has sides generally perpendicular to those opposing board surfaces. The sides of the hole, therefore, have corners which may be 90 degree angles, or somewhat less if they are mechanically rounded. These corners are those which typically coat too thin during electrophoretic deposition. This invention employs a thixotropic agent in the electrophoretic deposition solution to realize adequate coating, including at the edges of via holes. The thixotropic agent may also function to facilitate adhering metal to the outside of the metal surface as part of the circuitry.

Circuit boards with internal metal layers of the general kind of interest are described in the following: U.S. Pat. No. 4,321,290 to Thams; "Metal Core Boards—an alternative for cooling critical components," an article in "Circuits Manufacturing" September 1980, at pp. 74–80; and "Insulated Holes in Metal Core Substrates" by Keith F. Blurton, Francis J. Nuzzi and James Arachtingi, PCK Technology Division, Kollmorgen Corporation. All three of these disclose in more or less detail electrophoretic deposition to achieve an insulating layer on the internal metal body. None include a thixotropic agent in such an electrophoretic deposition liquid deposition composition.

Additionally, U.S. Pat. No. 4,145,460 to Finley et al is of general interest in that it teaches a printed circuit board with holes of the kind of interest with respect to this invention with a coating being from a powder. U.S. Pat. No. 3,892,646 to Lazzarini et al is of general interest in that it teaches electrophoretic deposition of insulating polymers of the kind of interest with respect to this invention with the coating not being for the internal metal of a circuit board and the coating bath not having a thixotropic agent.

U.S. Pat. No. 4,562,119 to Darms et al is of general interest in that it is directed to printed circuits and employs metal coated with polymers having siloxane groups. This invention differs basically in that it employs silicone dioxide or other thixotropic agent mixed with polymers.

DISCLOSURE OF THE INVENTION

In accordance with this invention, a thin metal sheet having holes suitable to be vias in a completed circuit board is electrophoretically coated with a mixture of resin and thixotropic material. The thixotropic material promotes thicker plating at edges. To further reduce unsatisfactory plating at edges, the edges are mechanically rounded prior to the electrophoretic coating. To strongly adhere the resin coating, particularly against thermal effects from soldering temperatures, the metal sheet is heavily roughened mechanically.

As electrical operation of a printed circuit fashioned on the coated sheet requires complete electrical insulation from the metal core, coating over the entire sheet is essential. Preferably fumed silicon dioxide is the thixotropic agent, which acts both to even the coating and as a material upon which metal plating of the circuitry of the printed circuit board is bonded.

BEST MODE FOR CARRYING OUT THE INVENTION

The Metal Substrate

An aluminum alloy sheet several inches square, for example 7 in. by 10 in. (approximately 17.78 cm by 25.4 cm) of thickness of 0.04 in. (approximately 0.1016 cm) is employed as the metal insert to be coated. This will be cut into small sections, each serving as individual printed circuit boards. The thickness is selected to be self supporting and to have adequate area to dissipate heat received from surrounding circuitry.

The metal insert may not be undesirably reactive to the electrophoretic plating bath used. Other characteristics of the metal insert generally may be selected without regard to this invention, since the plating experienced requires only that the metal be conductive. Therefore, the metal may be selected based on thermal conductivity, cost, strength, availability, and other factors as may be significant to the finished printed circuit. The material used in this preferred embodiment is type 2024 wrought aluminum, which comprises by weight 4.4% copper, 0.6% manganese, 1.5% magnesium and 93.5% aluminum and normal impurities.

The aluminum sheet will have holes through its thickness which vary in size depending upon the specific requirements of the circuitry to be held on the completed circuit board. The smallest hole presently under consideration is 0.032 in. (approximately 0.0813 cm) in diameter, with larger via holes typically ranging up to 0.051 in. (approximately 0.123 cm) in diameter. The typical sheet will also have mounting holes 0.125 in. (approximately 0.3175 cm) or larger in diameter. In the preferred application the holes are made by conventional drilling and routing, which leaves small burrs where the drill enters and large burrs where it exits.

The Resin Coating

Two materials are commercially available for electrophoretic coating on metals, acrylic resins and epoxy resins, and both may be used in accordance with this invention. In the embodiments disclosed, both employ commercial plating baths with additions of non-resins in accordance with this invention. The resins have heat resistance believed basically adequate and are good electrical insulators. The two plating liquids used are both products of Glidden Coatings & Resins, a Division of SCM Corp. as follows:

Epoxy resin bath: #2100 Clear 500 Cathodic Epoxy Electrolure, recommended for use combined with lactic acid and deionized water. Known to also contain isobutanol, monobutyl ether, and monohexyl ether.

Acrylic resin bath: #1100 Clear 680 Cathodic Acrylic Electrolure, also recommended for use combined with lactic acid and deionized water. Known to also contain denatured ethyl alchohol, 2-ethylhexyl alcohol, 2-ethoxyethanol, monobutyl ether, and monohexyl ether.

The Thixotropic Agent

The preferred thixotropic agent is fumed silicon dioxide, sold as Cab-O-Sil brand. It is a known thixotropic agent, and it is sold as having the ability to thicken non-polar and semi-polar liquid systems. Hydroxyl groups are attached to some of the silicon atoms of the particle surface, making the surface hydrophilic and capable of hydrogen bonding. It is produced by the hydrolysis of a silicon halide vapor in a flame of hydrogen and oxygen. It is of extremely small particle size and very large surface area. It has chain-forming tendencies. The true density of the aggregrate is 2.20 grams per milliliter.

Two grades in the following embodiments. The M-5 has surface area of $200+25$ m$^2$/gm, pH (4% in H$_2$O) of 3.5–4.2 and normal particle size of 0.014 micron in diameter. The HS-5 has surface area of $325+25$ m$^2$/gm, pH 3.6–4.2 (4% in H$_2$O) and normal particle size of 0.008 micron in diameter. No fundamental difference in effect appear from the use of either of the two grades in formulas otherwise suitable for use of the material.

Cab-O-Sil brand silicon dioxide is also sold as a frictionizing agent. This occures when the silicon dioxide is firmly embedded but partially exposed at the surface. This results in non-slip qualities.

Electroplating Over the Plated Metal

Electroplating over the coated metal after the coating has been treated to expose the thixotropic material as will be described below is by conventional plating techniques. Since no essential novelty and conventional plating skills are employed, these will be mentioned only briefly and generally.

Final Circuitry on the Circuit Board

This invention may be employed with conventionally populated and fabricated circuit boards. To utilize the advantages of this invention, the circuit board will be more densely populated than without the metal center or the circuit board will be intended to carry more current or to otherwise produce heat requiring dissipation by the metal center. The details of the circuitry may be entirely conventional and form no essential part or otherwise novel aspect of this invention. That circuitry therefore will not be described in further detail.

FABRICATION PROCEDURES

The 0.04 in. thick aluminum sheet having the drilled holes is first treated in a Sweco, Inc. deburring mill to eliminate sharp edges and to round the corners, since plating over sharp angles is often not effective. The mill comprises a liquid bath of abrasive chips, which are vigorously moved over the sheet. This operation is essentially a standard deburring operation. It is not known whether sharp edges are knocked off or pushed into the holes or both. The sheet is advantageously treated with 15% sodium hydroxide solution to clear burrs within the holes.

Next, the aluminum sheet is heavily roughened by a particle blasting step to promote adhesion of the subsequent coating, as is conventionally practiced. The degree of roughness has not been quantified, but it should be roughened at least to the degree that the roughness is visible. Roughening in 15% sodium hydroxide solution did promote adhesion, but not to a generally satisfactory degree. The bead blasting step may render superfluous the milling step but this has not been quantified.

The sheet is then thoroughly cleaned by a spray or vigorously moving bath of deionized water. The sheet is then supported at one point by a pinching clamp which also is electrically conductive, thereby serving as an electrical contact to the sheet. The clamped sheet is then immersed in an electrophoretic plating bath with its wide surface generally facing the wide surface of permanent plates in the bath which serve as anodes. The anodes are on opposite sides of the sheet and are equidistant from the sheet. The surface area of such anodes should be at least as large as the surface area of the item being plated. Plating in this manner is also conventional.

As the deionized water used in this process is exposed to the atmosphere, it is thought to possibly take on carbon dioxide and becomes acidic. A pH of 6.1 is typical.

Alternative plating bath formulas are as follows:

| Component | Parts By Weight | |
|---|---|---|
| FORMULA 1 | | |
| #2100 Clear 500 Cathodic Epoxy epoxy resin | 617 (393 | parts solids) |
| Lactic Acid | 19.6 | |
| Deionized Water | 3300.0 | |
| Cab-O-Sil (HS-5) fumed SiO$_2$ | 46.7 | |

Percent SiO$_2$ to solids $\frac{46.7}{440} \approx 10.6\%$

| | | |
|---|---|---|
| FORMULA 2 | | |
| #2100 Clear 500 Cathodic Epoxy epoxy resin | 132 (84.5 | parts solids) |
| Lactic Acid | 4.3 | |
| Deionized Water | 707 | |
| Cab-O-Sil M-5 fumed SiO$_2$ | 1.7 | |

Percent SiO$_2$ to solids $\frac{1.7}{86.2} \approx 2\%$

| | | |
|---|---|---|
| FORMULA 3 | | |
| #1100 Clear 680 Cathodic Acrylic acrylic resin | 570.2 (342 | parts solids) |
| Lactic Acid | 12.2 | |
| Deionized Water | 3300.0 | |
| Cab-O-Sil (HS-5) fumed SiO$_2$ | 37.2 | |

Percent SiO$_2$ to solids $\frac{37.0}{379} \approx 9.8\%$

| | | |
|---|---|---|
| FORMULA 4 | | |
| #1100 Clear 680 Cathodic Acrylic acrylic resin | 570.2 (342 | parts solids) |
| Lactic Acid | 12.2 | |
| Deionized Water | 3300.0 | |
| Cab-O-Sil HS-5/M5 fumed SiO$_2$ | 26.1 | |

Percent SiO$_2$ to solids $\frac{26.1}{368} \approx 7.1\%$

FORMULA 5

| Component | Parts By Weight |
| --- | --- |
| #1100 Clear 680 Cathodic Acrylic acrylic resin | 570.2 (342 parts solids) |
| Lactic Acid | 12.2 |
| Deionized Water | 3300.0 |
| Cab-O-Sil HS-5 fumed SiO$_2$ | 15.6 |

Percent SiO$_2$ to solids $\frac{15.6}{358} \approx 4.4\%$

Baths having 7% by weight of the silicon dioxide are highly satisfactory in most respects, but the relatively high amount of silicon dioxide seems to promote porosity in the coating. Accordingly, it is believed that coating baths having silicon dioxide at the lower end of the range practiced are preferable, possibly as low as 2% by weight of silicon dioxide.

During plating a pump continually recirculates the bath. Filtering, as by a cloth filter, maintains the continuing purity of the bath, but is undesirable to the extent it traps the silicon dioxide. Temperature is maintained at ambient room temperature. A large capacity voltage source is important. The aluminum sheet is the cathode. A 120 volt supply is attached electrically to the sheet and to the anode plates.

Current initially surges. Within 10 to 20 seconds, electrophoretic plating occurs and the voltage across the sheet and anode plates changes from a low value (e.g. 4 volts) to 120 volts (the limit permitted by the power supply). The plating is continued for 2 minutes.

The aluminum sheet is taken still clamped from the plating bath and immersed in deionized water. This is stirred vigorously so as to force water through the holes in the plate. The sheet is then taken from this water bath and sprayed with deionized water so as to remove any residual particles.

It is assumed at this point that there may be pinholes in the coating. The sheet is, therefore, returned to the plating bath under the previous conditions and the voltage is applied for 1 minute. It is then removed and cleaned in deionized water as after the first plating operation.

The clamped sheet is then hung in the air by the clamp for 30 minutes under ambient conditions. This permits the coating to flow together or coalesce as is believed does occur under the action of residual solvents from the plating bath. The plate is then placed in a gentle, forced-air oven at 60 degrees C. for 15 minutes. This is to expel residual solvents and other materials while avoiding vigorous expulsion which could cause bubbles. The sheet is then treated in a very-high-air-movement oven at 190 degrees C. for 15 minutes to complete expulsion of materials and crosslinking of the polymeric system. Electrical resistivity of the resulting resin coating is very high, indicating that all solvents are removed. Nominal thickness of that coating is 0.001 in. (approximately 0.00254 cm).

The outer resin surface must be coated with metal, which will serve as part of the circuitry of the final circuit board. To achieve the necessary film adhesion of the metal to the resin surface, the silicon dioxide must be exposed at the outer layer. This is done using a standard, commercially sold acid etching bath. Specifically, MacDermid Incorporated MACuplex L-43 etchant bath is used. This is a chromic, sulfuric acid bath. It chemically removes the resin, leaving the silicon dioxide exposed.

In this application, temperature is somewhat critical and must be close to 55 degrees C. Specific gravity is approximately 1.37 at 55 degrees C. Treatment time must be fairly precise, specifically 3 and ½ minutes, which can be varied between 3 to 4 minutes. This bath is gently agitated to promote uniform results in the holes. Agitation is by gentle bubbling with air controlled by a tube extending along the length of the bath with tiny holes throughout the surface of the tube. The tube is U-shaped so as to be primarily near the bottom of the bath. This tube is located on one side of the aluminum sheet and a heater is on the opposite side, with the holes in the sheet being a path between those two sides. The air agitation insures that the bath temperature is closely similar throughout the bath.

Immediately after the etching, the sheet is massively treated with deionized water by immersion. This is to decisively stop the etching operation. This is followed by an immersion rinse in deionized water for one minute, with gentle agitation by bubbles from a tube in the bath as described just above for the acid bath. Temperature is not sensitive.

The aluminum sheet is then treated in a 20% hydrofluoric-acid in water rinse for two minutes. This eliminates free silicon dioxide and residue from the preceding acid etch. The aluminum sheet is then rinsed by spraying of deionized water.

To eliminate any remaining metallic ions, a standard commercial bath which is a scavenger for metallic ions is employed. Specially, MacDermid Incorporated Metex Chrome Neutralizer 9080 is used. The sheet is immersed for 3 and ½ minutes in a bath of that product, followed by massive immersion in deionized water to terminate chemical activity. This is followed by a second immersion rinse.

The treated aluminum sheet is then plated with metal using a standard, commercially available system. Conditions and techniques employed are conventional. The former location of the clamp and all exposed surfaces are covered by SCOTCH brand plating tape #1280, as is conventional, which is applied directly and self-adheres to seal the exposed areas.

Briefly, the exposed areas are sealed: The sheet is immersed in a MacDermid Incorporated Metex 9008 bath for two minutes. This is understood to maintain the acid strength of the subsequent Metex 9070 bath against deterioration by plated parts as they are removed from that bath. The sheet is then immersed in a MacDermid Incorporated Metex 9070 bath for 5 minutes. This is understood to deposit a palladium chloride catalyst using stannous chloride to promote the firm attachment of the catalyst to the insulating layer. The sheet then rinsed with deionized water, followed by immersion in a MacDermid Incorporated Metex 9074 bath, an accelerator, followed by a deionized water rinse, followed by electroless deposition of copper by immersion in 3 parts by volume MacDermid Incorporated Metex 9072-E bath, 2 parts bt volume Metex 9073-E bath, and 15 parts by volume deionized water at 24 degrees C. for 15 minutes. This is followed by a deionized water rinse. This provides a metal coating on which copper is electrolytically plated, as is conventional. Further processing, including acid etching away of the copper to form circuit patterns, and populating the board with other circuit elements, is essentially identical to that for a circuit board not having an insulated metal sheet in accordance with this invention.

To fully utilize the results of this invention, the circuit board is one which generates significant heat, but at levels which are dissipated by the internal metal sheet.

Bentone 27, a magnesium aluminum silicate clay modified with a quarternary ammonium chloride compound, has been examined and shown to act similarly in this invention as the thixotropic agent. The Bentone 27 appeared to coat to full insulation in a reduced period of time and at a lower voltage than that used with the fumed silicon dioxide. Specifically, the following bath was employed. As equivalent results are realized with the fumed silicon dioxide in the same weight, that is shown as an alternative in the formula.

FORMULA 6

| Component | Parts By Weight |
| --- | --- |
| #1100 Clear #680 Cathodic Acrylic acrylic resin | 264 |
| Lactic Acid | 5.7 |
| Bentone Silicate Clay or Cab-O-Sil M5 fumed SiO$_2$ | 11.9 |
| Fluorusilicone debubbling agent (Dow-corning Corp. #7 paint additive, 5% solids in methyl isobutyl ketone | 1.4 |
| Deionized Water | 1480 |

Percent Clay or SiO$_2$ to solids $\frac{11.9}{171} \approx 7\%$

Variations and modifications within the spirit and scope of this invention can be anticipated. Accordingly, patent coverage is sought commensurate with the substance of this invention, as provided by law, with particular reference to the following claims.

We claim:

1. A printed circuit comprising a metal sheet with via holes for electrical connection between opposite surfaces of said sheet, said sheet being electrically insulated at said opposite surfaces and in said via holes by a continuous coating, formed without etching said holes to create an overhang of said coating, of electrically insulating organic resin containing fumed silicon dioxide thoroughly dispersed within said resin in an amount of about 2 percent to about 10 percent by weight of said fumed silicon dioxide to the weight of said resin, part of the circuitry of said printed circuit comprising a metal coated on said resin and silicon dioxide coating.

2. A printed circuit as in claim 1 in which said silicon dioxide is exposed on the surface of said coating of organic resin and silicon dioxide to directly contact said metal.

3. The process of fabricating a circuit board element comprising forming holes corresponding to via holes between opposite surfaces of a metal sheet, electrophoretically coating said metal sheet including the inside of said holes and said opposite surfaces from a bath having an electrically insulating organic resin and fumed silicon dioxide thoroughly dispersed within said resin in an amount of about 2 percent to about 10 percent by weight of said fumed silicon dioxide to the weight of said resin, treating said coated sheet to expose said fumed silicon dioxide on the outside of said coated sheet, and then electrolessly coating a metal to the outside of said coated sheet.

4. The process as in claim 1 in which said metal sheet is predominantly aluminum and said via holes are in the order of magnitude of 0.03 inch in diameter and larger.

* * * * *